(12) United States Patent
Brown et al.

(10) Patent No.: US 8,432,210 B2
(45) Date of Patent: Apr. 30, 2013

(54) FINE-GRAINED CLOCK SKEW TUNING IN AN INTEGRATED CIRCUIT

(75) Inventors: Jeffrey S. Brown, Fort Collins, CO (US); Mark Franklin Turner, Longmont, CO (US)

(73) Assignee: LSI Corporation, San Jose, CA (US)

( * ) Notice: Subject to any disclaimer, the term of this patent is extended or adjusted under 35 U.S.C. 154(b) by 58 days.

(21) Appl. No.: 12/938,172

(22) Filed: Nov. 2, 2010

(65) Prior Publication Data

US 2012/0105123 A1    May 3, 2012

(51) Int. Cl.
 *H03H 11/26*    (2006.01)
(52) U.S. Cl.
 USPC .......................................... 327/283; 327/285
(58) Field of Classification Search ......................... None
 See application file for complete search history.

(56) References Cited

U.S. PATENT DOCUMENTS

| | | | | |
|---|---|---|---|---|
| 5,352,945 A | * | 10/1994 | Casper et al. | 327/262 |
| 5,767,719 A | * | 6/1998 | Furuchi et al. | 327/281 |
| 6,240,542 B1 | | 5/2001 | Kapur | |
| 6,501,307 B1 | * | 12/2002 | Yen | 327/113 |
| 6,720,621 B1 | * | 4/2004 | Adan | 257/350 |
| 6,924,685 B2 | * | 8/2005 | Bae | 327/276 |
| 7,084,684 B2 | * | 8/2006 | Kim et al. | 327/276 |
| 7,106,139 B2 | * | 9/2006 | Morimoto et al. | 331/1 A |

* cited by examiner

*Primary Examiner* — An Luu
(74) *Attorney, Agent, or Firm* — Otterstedt, Ellenbogen & Kammer, LLP

(57) ABSTRACT

An apparatus for controlling clock skew in an integrated circuit (IC) includes timing circuitry operative to generate a clock signal for distribution in the IC and at least one buffer circuit operative to receive the clock signal, or a signal indicative of the clock signal, and to generate a delayed version of the clock signal as an output thereof. The buffer circuit includes at least first and second inverter stages and a resistive-capacitive (RC) loading structure. An output of the first inverter stage is connected to an input of the second inverter stage via the RC loading structure. The buffer circuit has a delay associated therewith that is selectively varied as a function of one or more adjustable characteristics of the RC loading structure. Clock skew in the IC is controlled as a function of the delay of the buffer circuit.

19 Claims, 5 Drawing Sheets

500

600

FINE-GRAINED CLOCK SKEW TUNING IN AN INTEGRATED CIRCUIT

FIELD OF THE INVENTION

The present invention relates generally to the electrical, electronic, and computer arts, and more particularly relates to balancing clock skew in an integrated circuit (IC).

BACKGROUND OF THE INVENTION

The arrival of clock signals at various nodes in a circuit should be precisely coordinated to ensure accurate transfer of data and control information in the circuit. Clock skew is a phenomenon, primarily in synchronous circuits, in which the clock signal, generally sent from a common clock circuit, arrives at different circuit nodes at different times. This is typically due to three primary causes. The first is a material flaw which causes a signal to travel faster or slower than anticipated. The second is distance; if the signal is required to travel the entire length of a circuit, it will likely (depending upon the size of the circuit) arrive at different parts of the circuit at different times. The third is the number of non-sequential (combinational) circuits in the signal path; propagation delay through circuits such as NAND and NOR gates adds to the overall propagation delay in a given signal path.

If large enough, clock skew can cause errors to occur in the circuit or cause the circuit to behave unpredictably. Suppose, for example, that a given logic path travels through combinational logic from a source flip-flop to a destination flip-flop. If the destination flip-flop receives a clock transition later than the source flip-flop, and if the logic path delay is short enough, then the data signal might arrive at the destination flip-flop before the clock transition, invalidating the previous data waiting there to be clocked through. This is often referred to as a "hold violation," since the data is not held long enough at the destination flip-flop to achieve a valid output result. Similarly, if the destination flip-flop receives the clock transition earlier than the source flip-flop, then the data signal has that much less time to reach the destination flip-flop before the next clock transition. If the data fails to reach the destination flip-flop before the next clock transition, a "setup violation" occurs, since the new data was not set up and stable prior to the arrival of the next clock transition.

Clock skew is generally influenced by one or more characteristics, including, for example, clock speed, clock driver strength, length of clock-carrying conductors, capacitance load on clock-carrying conductors, IC processing, power supply voltage level, temperature, noise, on-chip variation (OCV), number of combinational circuits, etc. The task of correcting clock skew is made more difficult by the interaction of these and other characteristics.

There are various known clock skew correction approaches. In one known skew correction technique, a "de-skew" phase-locked loop (PLL) or delay-locked loop (DLL) is employed to align the respective phases of the clock inputs at two or more components in the IC. This approach is described, for example, in the paper S. Tam, et al., "Clock Generation and Distribution for the First IA-64 Microprocessor," *IEEE J. Solid-State Circuits*, Vol. 35, No. 11, November 2000, pp. 1545-1552, which is incorporated by reference herein. Unfortunately, however, this approach suffers from area, power and complexity penalties, among other disadvantages. Another technique for reducing clock skew in the IC is to tune the clock speed. This approach is described, for example, in the paper T. Kehl, "Hardware Self-Tuning and Circuit Performance Monitoring," *In Proc. IEEE International Conference on Computer Design: VLSI in Computers and Processors*, 1993, pp. 188-192, which is incorporated by reference herein. Disadvantages of this approach include a significant performance reduction due, at least in part, to slower clock speeds.

It is also known to add one or more buffers to a clock signal path when attempting to perform clock tree balancing. This approach is undesirable, however, in that the buffers increase overall power consumption and OCV in the IC, and furthermore require additional IC area, among other disadvantages.

SUMMARY OF THE INVENTION

Principles of the invention, in illustrative embodiments thereof, advantageously allow fine-grained clock skew balancing in an IC to be performed in a low-power, footprint-compatible manner, without the need to move cells, change cell sizes or modifying chip-level routing. Accordingly, embodiments of the invention enable fine-grained tuning of clock tree delays without impacting OCV or chip floorplan.

In accordance with one aspect of the invention, an apparatus for controlling clock skew in an IC includes timing circuitry operative to generate a clock signal for distribution in the IC and at least one buffer circuit operative to receive the clock signal, or a signal indicative of the clock signal, and to generate a delayed version of the clock signal as an output thereof. The buffer circuit includes at least first and second inverter stages and a resistive-capacitive (RC) loading structure. An output of the first inverter stage is connected to an input of the second inverter stage via the RC loading structure. The buffer circuit has a delay associated therewith that is selectively varied as a function of one or more adjustable characteristics of the RC loading structure. Clock skew in the IC is controlled as a function of the delay of the buffer circuit.

In accordance with another aspect of the invention, a method is provided for controlling clock skew in an IC comprising timing circuitry operative to generate a clock signal for distribution in the integrated circuit and at least one buffer circuit adapted to receive the clock signal, or a signal indicative of the clock signal, and to generate a delayed version of the clock signal as an output thereof. The method includes the steps of: determining a delay of the buffer circuit; and controlling the delay of the buffer circuit so as to match prescribed timing specifications of the timing circuitry by varying one or more adjustable characteristics of an RC loading structure in the buffer circuit, the RC loading structure being coupled between an output of a first inverter stage and an input of a second inverter stage in the buffer circuit. Clock skew in the IC is controlled as a function of the delay of the buffer circuit.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF THE INVENTION

The present invention will be described herein in the context of illustrative clock skew balancing and/or correction architectures. It should be understood, however, that the present invention is not limited to these or any particular clock skew balancing and/or correction circuit arrangements. Rather, the invention is more generally suitable for use in any circuit application in which it is desirable to provide improved performance, at least in terms of avoiding clocking-related problems such as clock skew, and the accompanying violation of setup and hold times associated therewith. In this manner, techniques of the present invention provide fine-grained clock skew balancing in an IC without increasing power consumption and OCV, and without impacting chip floorplan or changing chip-level routing.

Embodiments of the present invention thus offer significant advantages over conventional clock skew balancing and/or correction methodologies. Moreover, it will become apparent to those skilled in the art given the teachings herein that numerous modifications can be made to the embodiments shown that are within the scope of the present invention. That is, no limitations with respect to the specific embodiments shown and described herein are intended or should be inferred.

Although reference may be made herein to n-channel metal-oxide-semiconductor (NMOS) or p-channel metal-oxide-semiconductor (PMOS) transistor devices which may be formed using a complementary metal-oxide-semiconductor (CMOS) IC fabrication process, the invention is not limited to such devices and/or such an IC fabrication process. Furthermore, although preferred embodiments of the invention may be fabricated in a silicon wafer, embodiments of the invention can alternatively be fabricated in wafers comprising other materials, including but not limited to gallium arsenide (GaAs), indium phosphide (InP), etc.

Figure 1A:
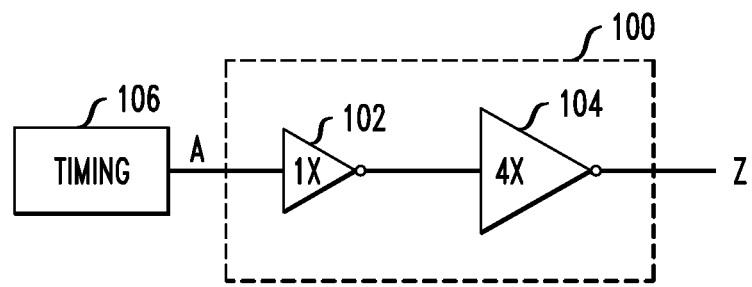
FIG. 1A is a block diagram depicting an exemplary buffer circuit in which techniques of the present invention may be implemented.

FIG. 1A is a block diagram depicting an exemplary buffer circuit 100 in which techniques of the invention may be implemented. As will be appreciated by the skilled artisan, buffer circuits are typically employed in clock generation circuitry as a means for distributing the clock signal throughout an IC. Buffer circuit 100 preferably comprises a first inverter stage 102 and a second inverter stage 104 connected together in a series configuration. Specifically, an input of first inverter stage 102 is adapted for receiving an input signal, A, an output of the first inverter stage is connected to an input of second inverter stage 104, and an output of the second inverter stage is adapted to generate an output signal, Z, of the buffer circuit 100. Signal A may be, for example, a clock signal generated by timing circuitry 106 in the IC or external thereto.

Since an even number of inverter stages are used, buffer circuit 100 may be considered to be a non-inverting buffer, and thus output signal Z will be of the same logical state (e.g., "0" or "1") as input signal A. Although only two inverter stages are shown, it is to be appreciated that buffer circuit 100 is not limited to any specific number of inverter stages. Moreover, an inverting buffer circuit is similarly contemplated in which an odd number of inverter stages (e.g., 1, 3, 5, etc.) are employed, according to other embodiments of the invention.

As shown in FIG. 1A, the second inverter stage 104 has an output drive capability (4×) that is four times greater than a drive capability (1×) of the first inverter stage 102. It is to be understood that the invention is not limited to any specific ratio of drive capabilities between the inverter stages. For example, the first and second inverter stages may be formed having substantially the same drive capability. In other embodiments, the first inverter stage 102 may have a greater drive capability than the second inverter stage 104. It is preferred, however, that an output inverter stage (e.g., second inverter stage 104) have a drive capability that is greater than an input inverter stage (e.g., first inverter stage 102) of the buffer circuit 100.

Figure 1B:
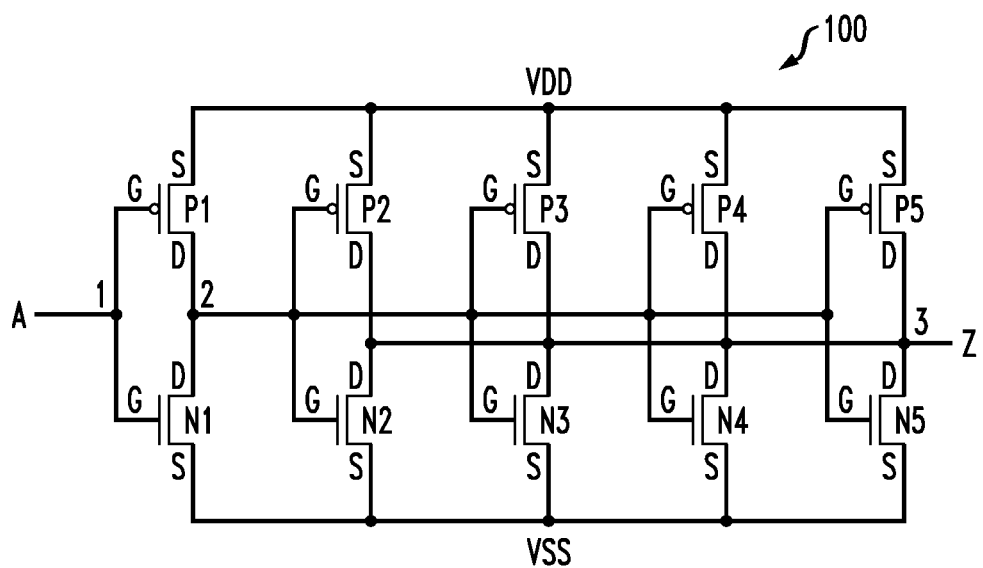
FIG. 1B is a circuit diagram depicting a transistor level implementation of the illustrative buffer circuit shown in FIG. 1A.

FIG. 1B is a circuit diagram depicting a transistor level implementation of the illustrative buffer circuit 100 shown in FIG. 1A. Assuming all PMOS transistor devices in the buffer circuit 100 are substantially the same size (e.g., same channel width-to-length ratios) and all NMOS transistor devices are substantially the same size, one way to increase the drive capability of an inverter stage is to employ a plurality of PMOS transistors connected in parallel with one another and, similarly, to employ a plurality of NMOS transistors connected in parallel with one another. Thus, the second inverter stage 104 is formed having four times the number of transistors compared to the first inverter stage 102. The same ratio of drive capabilities can alternatively be achieved by using more or less transistor devices in the second inverter stage 104 and by modifying a channel width-to-length (W/L) ratio of the devices accordingly, as will be apparent to those skilled in the art. For example, keeping the same drive ratio between the first and second inverter stages, eight transistors can be used in the second inverter stage 104, each transistor having a W/L ratio that is half the W/L ratio of the transistors in the first inverter stage 102. Likewise, two transistors can be used in the second inverter stage 104, each transistor having a W/L ratio that is double the W/L ratio of the transistors in the first inverter stage 102.

With reference to FIG. 1B, first inverter stage 102 includes a first PMOS transistor P1 and a first NMOS transistor N1. Gates (G) of transistors P1 and N1 are connected together at node 1 and form the input of the first inverter for receiving input signal A, a source (S) of transistor P1 is adapted for connection to a first voltage source, which may be VDD (e.g., 1.0 volt), drains (D) of transistors P1 and N1 are connected together at node 2 and form the output of the first inverter, and a source of transistor N1 is adapted for connection to a second voltage source, which may be VSS (e.g., ground or zero volt). The second inverter stage 104 includes second, third, fourth and fifth PMOS transistors P2, P3, P4 and P5, respectively, and second, third, fourth and fifth NMOS transistors N2, N3, N4 and N5, respectively. Sources of transistors P2, P3, P4 and P5 are adapted for connection to VDD and sources of transistors N2, N3, N4 and N5 are adapted for connection to VSS. Gates of transistors P2, P3, P4, P5, N2, N3 N4 and N5 are connected together and form the input of the second inverter stage 104, which in turn is connected to the output of the first inverter 102 at node 2. Likewise, drains of transistors P2, P3, P4, P5, N2, N3, N4 and N5 are connected together at node 3 and form the output of second inverter stage 104 for generating output signal Z.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

Figure 2:
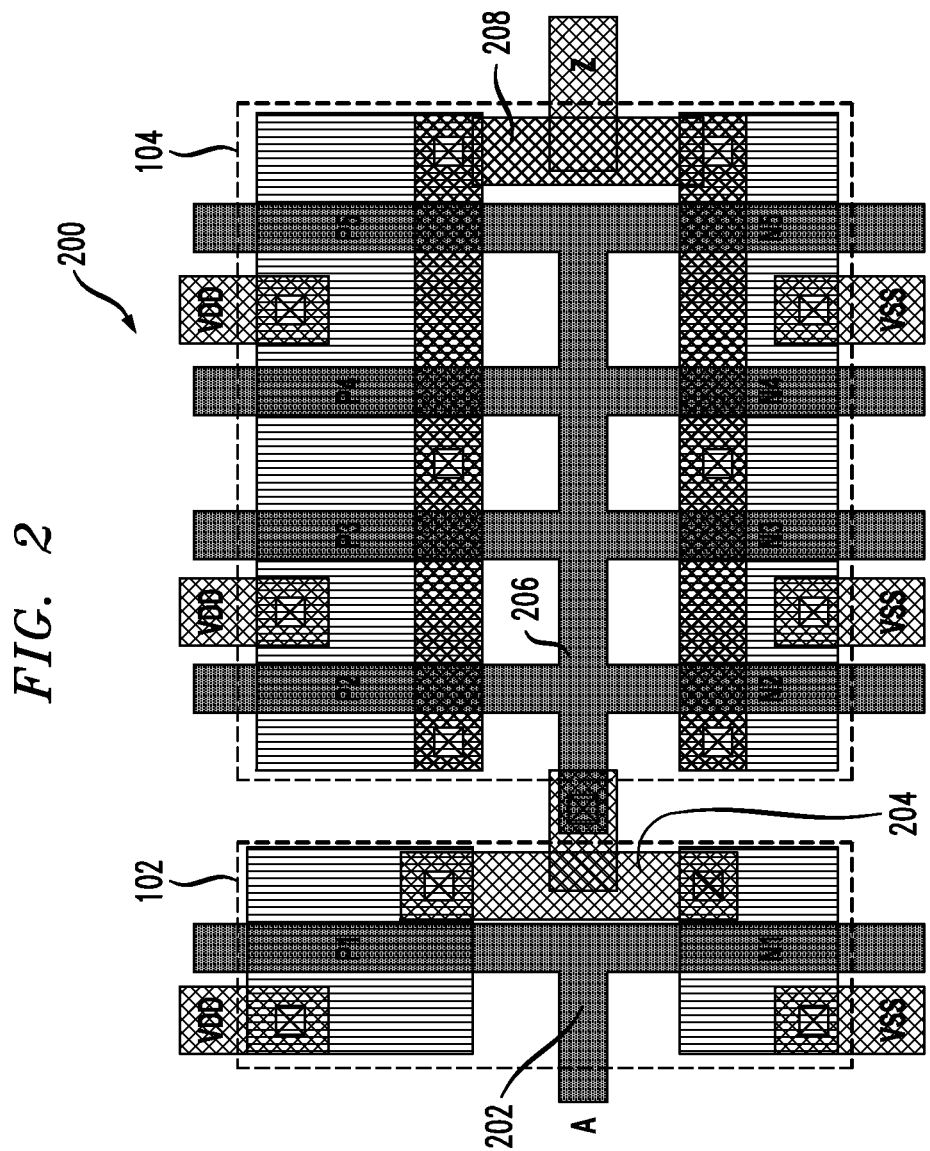
FIG. 2 is an exemplary IC layout of the illustrative buffer circuit depicted in FIGS. 1A and 1B, according to an embodiment of the present invention.

With reference now to FIG. 2, an exemplary IC layout 200 of the illustrative buffer circuit 100 depicted in FIGS. 1A and 1B is shown, according to an embodiment of the invention. As shown in the illustrative IC layout 200, the plurality of parallel PMOS transistors P2, P3, P4 and P5, and the plurality of parallel NMOS transistors N2, N3, N4 and N5, in the second inverter stage 104 are formed as a multi-fingered structure. Input signal A is presented to a first polysilicon (poly) routing 202 forming the gates of PMOS transistor P1 and NMOS transistor N1 in the first (1×) inverter stage 102. A first metal trace 204 connected to the output of the first inverter stage 102 is connected to a second poly routing 206 forming the gates of PMOS transistors P2, P3, P4 and P5 and NMOS transistors N2, N3, N4 and N5 in the second (4×) inverter stage 104. Output signal Z is driven on a second metal trace 208 connected to the output of the second inverter stage 104.

Due at least in part to its inherent impedance (e.g., resistance and capacitance), the poly routing 206 will have a prescribed delay associated therewith. The amount of delay corresponding to the poly routing will be a function of a length and/or shape of the routing, among other factors. The term "shape" as used herein to describe the poly routing 206, is intended to be broadly defined and may include, but is not limited to, an aspect ratio of a cross section of the poly routing. The shape of the poly routing 206 may also be defined by other geometrical properties of the routing, such as, for example, the number of corners (i.e., bends) used in forming the routing. Other factors that may affect the impedance of the poly routing 206 may include, for example, a doping concentration of the polysilicon material forming the routing. Adding a silicide layer to the poly routing can also affect the impedance thereof.

As the length of a given poly routing increases, the parasitic resistance and capacitance of the given routing, and thus the delay of the routing, will increase accordingly. Although any length of poly routing will have some finite amount of parasitic delay associated therewith, the illustrative IC layout 200 which preferably includes a minimum poly routing length for the second inverter stage 104, is representative of a comparatively fast implementation of the buffer circuit 100, according to an embodiment of the invention. By adjusting the resistive-capacitive (RC) loading at an output of one or more inverter stages of the buffer circuit, a delay of the buffer circuit can be controlled as desired. Thus, by modifying one or more characteristics of the poly routing 206, which may include, for example, modifying a shape and/or length of the poly routing, changing a doping concentration of the polysilicon material forming the routing, adding or removing contacts in the poly routing for increasing or decreasing, respectively, gate-to-contact loading, etc., parasitic delay internal to the buffer circuit cell layout 200 can be advantageously controlled.

When used in conjunction with a clock distribution system, or alternative timing circuitry, one or more characteristics of the poly routing 206 can be advantageously modified to optimize (e.g., balance) clock skew in the system.

By way of illustration only and without loss of generality, while the internal delay of the buffer circuit 100 can be modified by altering a delay of the first (input) inverter stage 102, the internal delay of the buffer circuit will be primarily influenced by controlling a delay of the second (output) inverter stage 104. This is due, at least in part, to the ratio of drive capability between the first and second inverter stages. As such, the discussion herein will focus primarily on modification of the length and/or shape of poly routing 206 in the second inverter stage 104, with the understanding that modification of a similar poly routing in the first inverter stage may also be used to control a delay of the buffer circuit to at least some extent. In this instance, metal trace 204 in the first inverter stage 102 can be replaced by a poly routing of a desired length and/or shape for controlling delay in the buffer circuit. In fact, modification of the length and/or shape of poly routing 206 in the second inverter stage 104 may be used as a coarse delay control, while modification of the length and/or shape of a poly routing in the first inverter stage 102 may be used as a fine delay control in the buffer circuit 200, in accordance with an aspect of the invention.

In accordance with an embodiment of the invention, in order to increase a delay of buffer circuit 200, poly routing 206 can be increased in length by adding more transistors to the second inverter stage 104. In order to maintain the same drive ratio between the first and second inverter stages (if desired), the W/L ratio of the respective devices (e.g., P2, P3, P4, P5, N2, N3, N4, N5) in the second inverter stage 104 can be modified accordingly, as previously explained. Other means for adjusting one or more characteristics of the poly routing 206 to thereby control a delay of the buffer circuit are contemplated, as will be described in further detail below.

Figure 3:
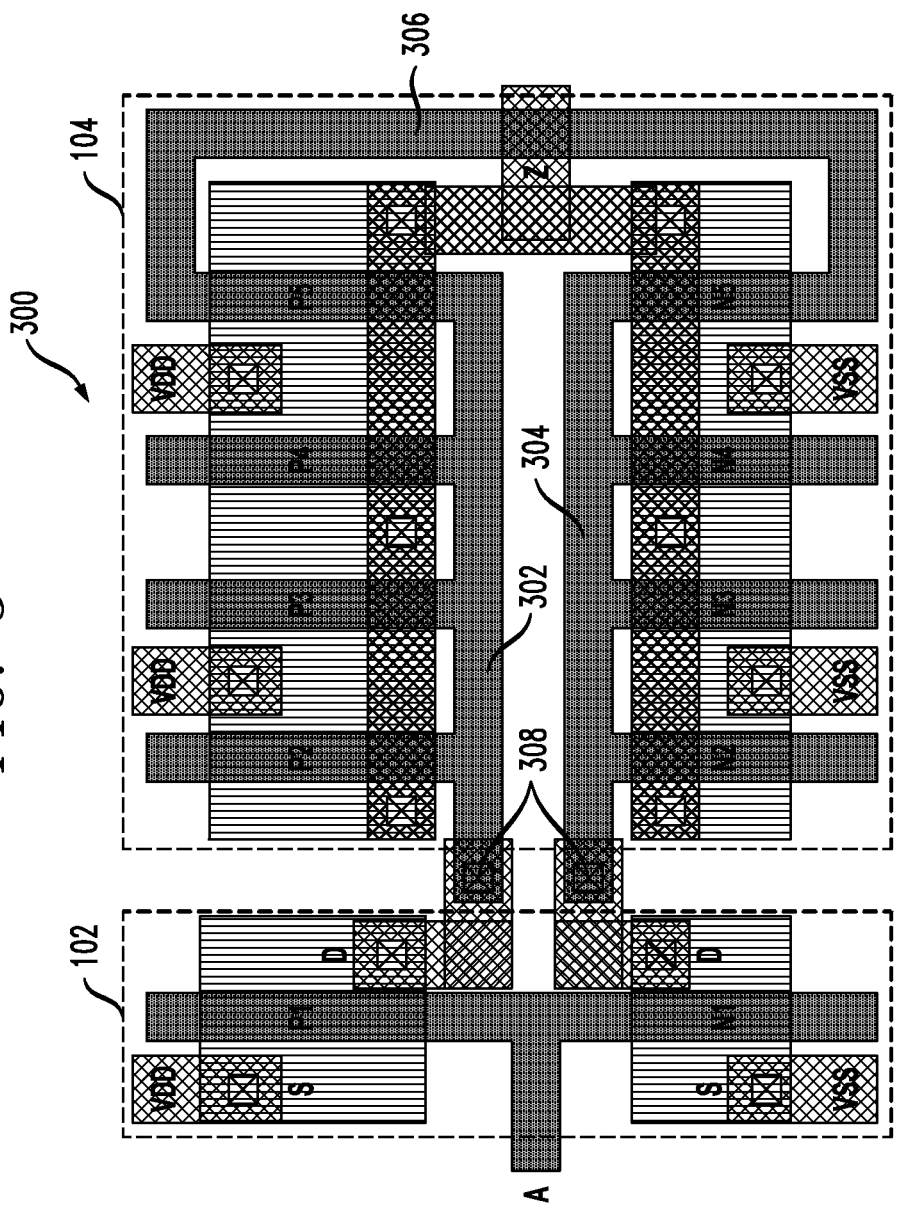
FIG. 3 is an exemplary IC layout of the illustrative buffer circuit depicted in FIGS. 1A and 1B, according to another embodiment of the present invention.

FIG. 3 is an exemplary IC layout 300 of the illustrative buffer circuit 100 depicted in FIGS. 1A and 1B, according to another embodiment of the invention. Like the IC layout 200 shown in FIG. 2, the second inverter stage 104 in IC layout 300 is formed having a multi-fingered arrangement for PMOS transistors P2, P3, P4 and P5, and NMOS transistors N2, N3, N4 and N5. Unlike in layout 200, however, separate multi-fingered poly routing structures are used for the gates of the PMOS transistors P2 through P5 and NMOS transistors N2 through N5 in the second inverter stage 104 of IC layout 300 (e.g., metal trace 204 shown in FIG. 2 is divided into separate conductive segments in layout 300; one for the PMOS devices and one for the NMOS devices).

Specifically, second inverter stage 104 in IC layout 300 includes a first poly routing structure 302 forming the gates of PMOS transistors P2, P3, P4 and P5, and a second poly routing structure 304 forming the gate of NMOS transistors N2, N3, N4 and N5. The first poly routing 302 is connected to PMOS transistor P1 in the first inverter stage 102 and the second poly routing 304 is connected to NMOS transistor N1 in the first inverter stage. The first and second poly routings 302 and 304, respectively, are electrically coupled together by a third poly routing 306 to complete a circuit loop between the drain of PMOS transistor P1 and the drain of NMOS transistor N1. Collectively, poly routings 302, 304 and 306 form an RC loading structure which, by controlling one or parameters thereof (e.g., length, width, shape, etc.), is operative to adjust a delay of the buffer circuit, as will be described in further detail below. Thus, output current flowing between PMOS transistor P1 and NMOS transistor N1 in the first inverter stage 102 must pass through the RC loading structure.

The poly routing structure in buffer layout 300 adds resistance and capacitance at the output of the first inverter stage which effectively increases the delay of the buffer circuit 100. In comparison to the buffer layout 200 shown in FIG. 2, buffer layout 300 is a substantially slower implementation. The footprint of layout 300, however, remains entirely compatible with layout 200, which is virtually the same except for the poly routing in the second inverter stage 104 (i.e., the poly routing structure does not change the overall footprint of the buffer circuit). Of course, as will become apparent to those skilled in the art given the teachings herein, various other layout arrangements can be employed for providing a delay somewhere between the fast buffer implementation depicted in FIG. 2 and the slow buffer implementation depicted in FIG. 3, in accordance with embodiments of the invention.

With continued reference to exemplary buffer layout 300 shown in FIG. 3, when signal A transitions from a logic high (e.g., "H" or "1") to a logic low (e.g., "L" or "0"), the NMOS transistor N1 turns off and the PMOS transistor P1 turns on, thereby driving the output of the first inverter stage 102 from low to high. The high level will propagate clockwise (CW) around the poly routing loop from the metal contact at the drain of transistor P1, through poly routings 302, 306 and 304, to the metal contact at the drain of transistor N1. Prior to activating the NMOS devices N2, N3, N4 and N5 in the second inverter stage 104, the PMOS devices P2, P3, P4 and P5 will be turned off. The assertion of the NMOS devices N2, N3, N4 and N5 will be delayed as a function of the RC loading (i.e., impedance) of the poly routing.

Specifically, the voltage of a given circuit node as a function of time may be defined as follows:

$$V(t) = V_o e^{-\frac{t}{\tau}},$$

where V(t) is the voltage of the given circuit node at time t, $V_O$ is the initial voltage of the circuit node, and $\tau$ is the time constant given by the product RC associated with the poly routings. Thus, the greater the resistance and/or capacitance of the poly routing, the greater the time constant and corresponding delay.

Likewise, when the input signal A transitions from low to high, the NMOS transistor N1 turns on and the PMOS transistor P1 turns off, thereby driving the output of the first inverter stage 102 from high to low. The low level output of the first inverter stage 102 will propagate counter-clockwise (CCW) around the poly routing loop comprising poly routings 302, 306 and 304. Prior to activating the PMOS devices P2, P3, P4 and P5 in the second inverter stage 104, the NMOS devices N2, N3, N4 and N5 will be turned off. The assertion of the PMOS devices P2, P3, P4 and P5 will therefore be delayed as a function of the RC impedance of the poly routings.

By way of example only and without loss of generality, in the case of a 65-nanometer (nm) salicided polysilicon CMOS fabrication process, the delay variation possible in an 8-times (8×) buffer circuit utilizing techniques of the invention is about zero to 9 picoseconds (ps). Consequently, delays corresponding to a clock tree comprising a plurality of such buffer circuits formed according to techniques of the invention can be beneficially shifted by about 0 to 9 ps without changing a floorplan or OCV of the buffer circuits. The variation in delay that is achievable in the buffer circuit would increase for larger buffer sizes, since the length of the poly routing can be increased accordingly. Moreover, additional variation in delay control would be achievable if contact variations in conjunction with the poly routing were also included (e.g., metal contacts 308 connecting the drains of transistors P1 and N1 to the poly routings 302 and 304, respectively).

Figure 4:
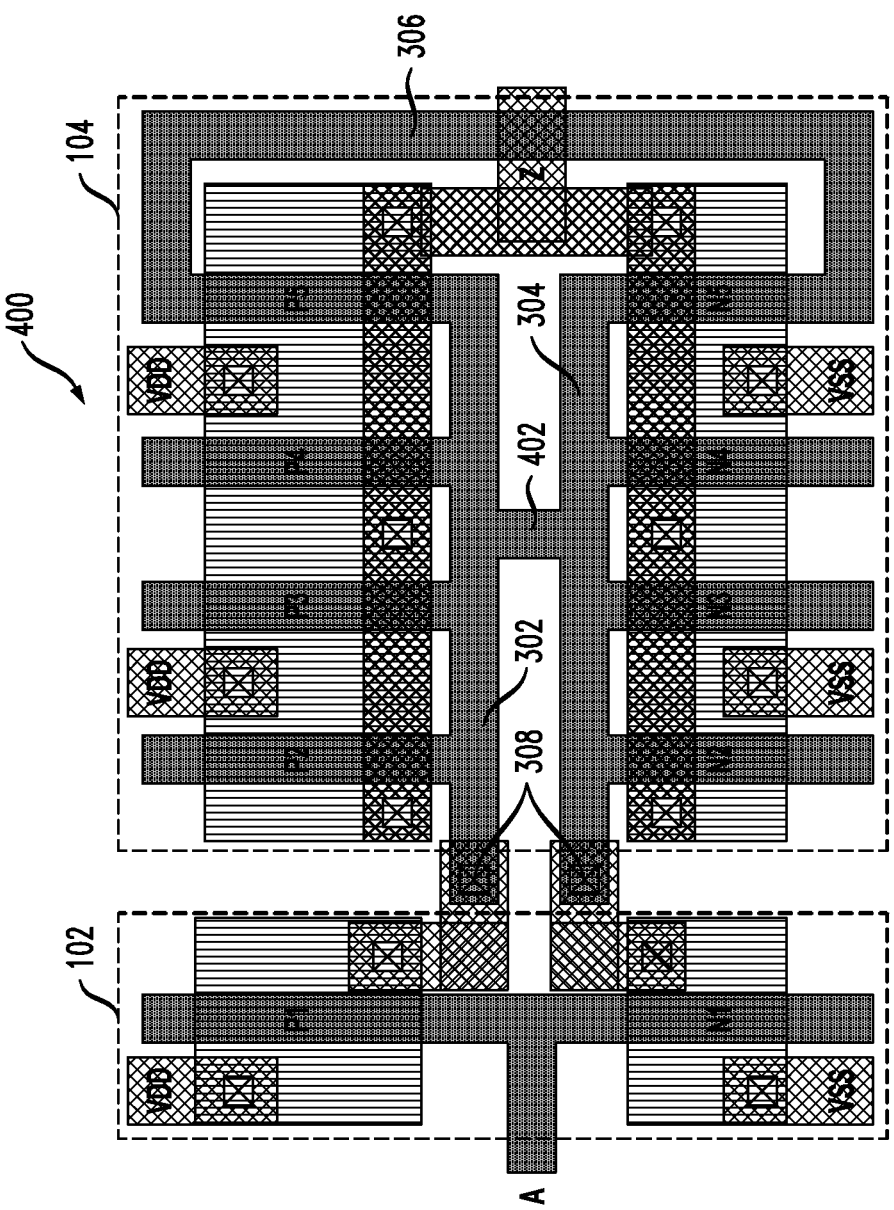
FIG. 4 is an exemplary IC layout of the illustrative buffer circuit depicted in FIGS. 1A and 1B, according to yet another embodiment of the present invention.

FIG. 4 is an exemplary IC layout 400 of the illustrative buffer circuit 100 depicted in FIGS. 1A and 1B, according to an embodiment of the invention. Layout 400 is essentially the same as layout 300 shown in FIG. 3, except for the insertion of a poly jumper 402 between the first and second poly routings 302 and 304, respectively. It is to be understood that although a poly jumper is shown in layout 400, the jumper material is not limited to poly. Rather, jumper 402 may alternatively be formed of any conductor, such as, for example, metal. In this instance, the metal jumper would be connected to the poly routings 302 and 304 by way of a metal contact (not explicitly shown), in a manner similar to the connection of the poly routings to contacts 308. Additional delay control resolution may be obtained in this manner by varying a size of one or more of the metal contacts in the poly routings.

The exemplary embodiment shown in FIG. 4 provides a means of selectively adjusting the delay of the buffer circuit 100 somewhere between the fast implementation depicted in FIG. 2 and the slow implementation depicted in FIG. 3. The jumper 402 can be placed essentially anywhere in the poly routing structure, with the delay variation of the buffer being a function of a position of the jumper. Thus, for example, if the jumper 402 were to be placed between the two metal contacts 308 connecting to the drains of transistors P1 and N1 in the first inverter stage 102, the poly routing structure comprising poly routings 302, 306 and 304 would effectively be bypassed, thereby minimizing the delay in the buffer circuit (e.g., closer to the buffer circuit implementation of FIG. 2). As the placement of jumper 402 is slid to the right between the two poly routings 302 and 304, the delay in the buffer circuit will increase accordingly (since the resistive and capacitive loading will increase in the poly routing structure).

In this manner, a methodology for balancing clock skew would preferably comprise controlling a delay in the buffer circuit, such as, for example, by selectively modifying a position of jumper 402 in the poly routing structure. According to other embodiments of invention in which the buffer circuit includes more than two inverter stages, a poly routing structure, e.g., similar to the poly routing structure described above in conjunction with FIGS. 3 and 4, may be included between one or more adjacent inverter stages for providing additional delay control, as will become apparent to those skilled in the art given the teachings herein.

Figure 5:
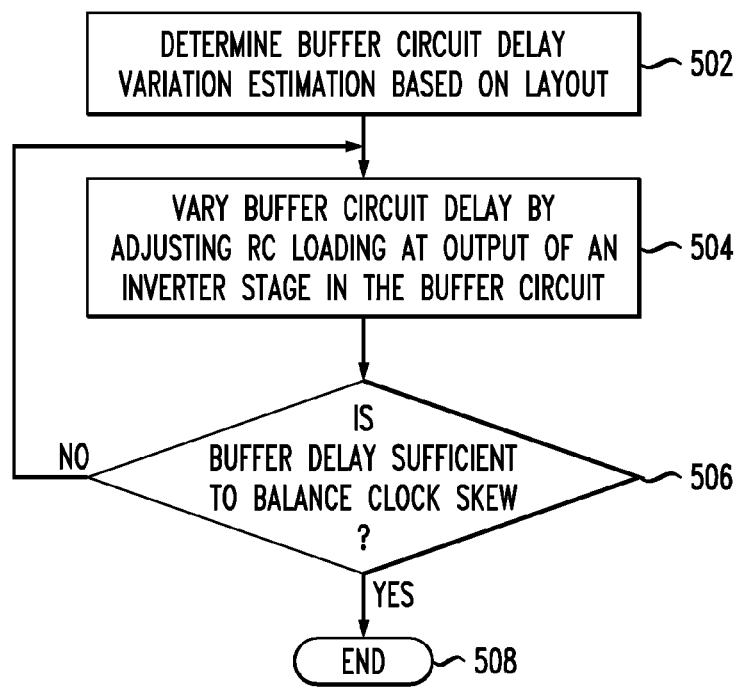
FIG. 5 is a flow diagram depicting steps in an exemplary method for balancing clock skew in an IC, according to an aspect of the present invention.

FIG. 5 is a flow diagram depicting steps in an exemplary method 500 for balancing clock skew in an IC, according to an aspect of the invention. In step 502, the delay of a buffer circuit cell, used, for example, in clock generation circuitry in the IC, is determined. The clock generation circuitry may employ a plurality of such buffer circuit cells, as is often the case in a clock generation and distribution system. The delay may be estimated, for example, based on an IC layout of the buffer circuit cell using known techniques, including, but not limited to, design rule checking (DRC), layout versus schematic (LVS) and parasitic parameter extraction tools (e.g., Calibre® nmDRC, Calibre® nmLVS and Calibre® xRC™, registered trademarks of Mentor Graphics Corporation).

In step 504, buffer circuit delay is selectively varied, according to techniques of the invention, illustrative embodiments of which were described above in conjunction with FIGS. 2 through 4, such as by adjusting the RC loading at an output of one or more inverter stages of the buffer circuit. As previously explained, the RC loading may be adjusted, for example, by selectively changing one or more parameters (e.g., length, width, shape, etc.) of a poly routing structure connecting the drains of the PMOS and NMOS transistors in a given inverter stage, thereby varying the delay of the buffer circuit.

As was described above in conjunction with FIG. 4, buffer circuit delay may be adjusted by varying a position of a jumper 402 in parallel with the poly routing structure comprising poly routings 302, 304 and 306 (see FIG. 4). Selectively adjusting a position of the jumper may be performed manually, such as with the aid of known IC design and layout tools (e.g., Synopsys IC Compiler (ICC), commercially available from Synopsys, Inc., Magma Talus®, commercially available from Magma Design Automation Inc., Cadence First Encounter™ (FE), commercially available from Cadence Design Systems, Inc., etc.). Alternatively, such modification of the poly routing (e.g., placement of the jumper 402 in FIG. 4) can be automated, such as, for example, by using an overlay cell or by using a route-by-label function available on some IC layout tools which automatically creates routes between multiple points as guided by text or labels. In an illustrative overlay cell methodology, a separate file is generated which correlates instances of one or more cells in the IC design to corresponding overlays. This file is then preferably used to feed a script within the IC layout tool such that different overlays are dropped onto the respective cells on an instance-by-instance basis.

In step 506, buffer circuit delay is checked to determine if such delay is sufficient to balance or otherwise reduce clock skew in the IC. When it is determined that the amount of delay is insufficient to balance clock skew to within a prescribed range, the method 500 reverts to step 504 wherein further delay adjustment is performed. Otherwise, when the amount of delay is sufficient to balance clock skew to within prescribed operating criteria, the method 500 ends at step 508.

Figure 6:
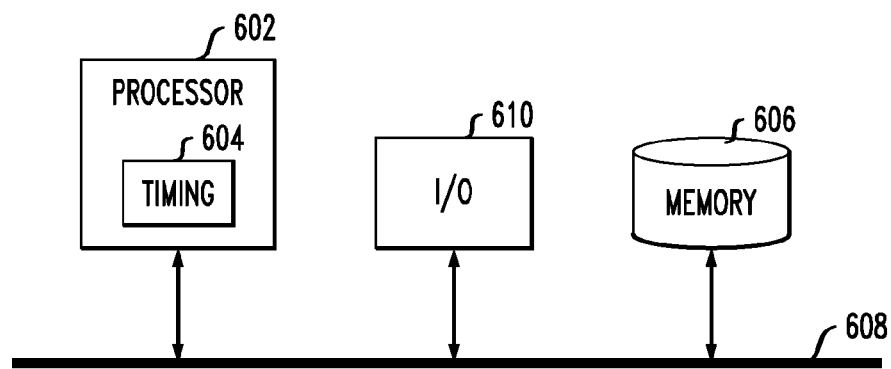
FIG. 6 is a block diagram depicting an exemplary data processing system, according to an aspect of the present invention.

Embodiments of the present invention, or aspects thereof, may be particularly well-suited for use in an electronic device or alternative processing system (e.g., clock generation/distribution system, etc.). For example, FIG. 6 is a block diagram depicting an exemplary processing system 600 formed in accordance with an aspect of the invention. System 600 may include a processor 602 including timing circuitry 604 for clock generation/distribution, memory 606 coupled to the processor (e.g., via a bus 608 or alternative connection means), as well as input/output (I/O) circuitry 610 operative to interface with the processor. Timing circuitry 604 incorporates delay adjustment techniques of the invention as described above in conjunction with FIGS. 2 through 4. The processor 602 may be configured to perform at least a portion of the methodologies of the present invention, an illustrative embodiment of which is shown in FIG. 5 and described above.

It is to be appreciated that the term "processor" as used herein is intended to include any processing device, such as, for example, one that includes a central processing unit (CPU) and/or other processing circuitry (e.g., network processor, digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor. In any case, it is to be appreciated that at least a portion of the components shown in the previous figures may be implemented in various forms of hardware, software, or combinations thereof (e.g., one or more DSPs with associated memory, application-specific integrated circuit(s), functional circuitry, one or more operatively programmed general purpose digital computers with associated memory, etc). Given the teachings of the invention provided herein, one of ordinary skill in the art will be able to contemplate other implementations of the components of the invention.

At least a portion of the illustrative techniques of the present invention may be implemented in the manufacture of an integrated circuit. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An apparatus for controlling clock skew in an integrated circuit, comprising:
   timing circuitry operative to generate a clock signal for distribution in the integrated circuit; and
   at least one buffer circuit operative to receive the clock signal and to generate a delayed version of the clock signal as an output thereof, the buffer circuit including at least first and second inverter stages and a resistive-capacitive (RC) loading structure, an output of the first inverter stage being connected to an input of the second inverter stage via the RC loading structure, the buffer circuit having a delay associated therewith that is selectively varied as a function of one or more adjustable characteristics of the RC loading structure;
   wherein clock skew in the integrated circuit is controlled as a function of the delay of the at least one buffer circuit;
   wherein the second inverter stage comprises a first plurality of transistors and a second plurality of transistors, the first plurality of transistors being of opposite conductivity relative to the second plurality of transistors, the RC loading structure being connected to the first and second plurality of transistors and completing an electrical path between the first plurality of transistors and the second plurality of transistors.

2. The apparatus of claim 1, wherein the RC loading structure in the buffer circuit comprises a polysilicon routing connected between the output of the first inverter stage and the input of the second inverter stage.

3. The apparatus of claim 2, wherein a delay of the buffer circuit is controlled by at least one of varying at least one of an effective length of the polysilicon routing and a shape of the polysilicon routing, varying a doping concentration of the polysilicon routing, and adding a silicide layer to the polysilicon routing.

4. The apparatus of claim 2, wherein the polysilicon routing comprises at least one jumper operative to electrically short two or more elements of the polysilicon routing, at least one of a resistance and a capacitance of the polysilicon routing being controlled by selectively adjusting a position of the jumper along the polysilicon routing.

5. The apparatus of claim 1, wherein a drive capability of the second inverter stage is configured to be greater than a drive capability of the first inverter stage in the buffer circuit.

6. The apparatus of claim 1, wherein the first inverter stage comprises at least a first transistor and a second transistor, the first and second transistors being of opposite conductivity relative to one another, the RC loading structure being connected to the first and second transistors and completing an electrical path therebetween.

7. The apparatus of claim 1, wherein the RC loading structure in the at least one buffer circuit is formed in a manner that does not change a footprint of the at least one buffer circuit.

8. The apparatus of claim 1, wherein each of the first and second plurality of transistors comprises at least two transistors connected together in parallel and having a multiple-fingered gate structure.

9. The apparatus of claim 8, wherein the multiple-fingered gate structure of each of the first and second plurality of transistors forms at least a portion of the RC loading structure.

10. An integrated circuit, comprising at least one apparatus for controlling clock skew, the at least one apparatus comprising:
   timing circuitry operative to generate a clock signal for distribution in the integrated circuit; and
   at least one buffer circuit operative to receive the clock signal and to generate a delayed version of the clock signal as an output thereof, the buffer circuit including at least first and second inverter stages and a resistive-capacitive (RC) loading structure, an output of the first inverter stage being connected to an input of the second inverter stage via the RC loading structure, the buffer circuit having a delay associated therewith that is selectively varied as a function of one or more adjustable characteristics of the RC loading structure;
   wherein clock skew in the integrated circuit is controlled as a function of the delay of the at least one buffer circuit;
   wherein the second inverter stage comprises a first plurality of transistors and a second plurality of transistors, the first plurality of transistors being of opposite conductivity relative to the second plurality of transistors, the RC loading structure being connected to the first and second plurality of transistors and completing an electrical path between the first plurality of transistors and the second plurality of transistors.

11. A method for controlling clock skew in an integrated circuit comprising timing circuitry operative to generate a clock signal for distribution in the integrated circuit and at least one buffer circuit adapted to receive the clock signal and to generate a delayed version of the clock signal as an output thereof, the method comprising the steps of:
   determining a delay of the at least one buffer circuit; and
   controlling the delay of the at least one buffer circuit so as to match prescribed timing specifications of the timing circuitry by varying one or more adjustable characteristics of a resistive-capacitive (RC) loading structure in the at least one buffer circuit, an output of a first inverter stage being connected with an input of a second inverter stage in the buffer circuit through the RC loading structure;
   wherein clock skew in the integrated circuit is controlled as a function of the delay of the at least one buffer circuit;
   wherein the second inverter stage comprises a first plurality of transistors and a second plurality of transistors, the first plurality of transistors being of opposite conductivity relative to the second plurality of transistors, the RC loading structure being connected to the first and second plurality of transistors and completing an electrical path between the first plurality of transistors and the second plurality of transistors.

12. The method of claim 11, wherein the step of determining the delay of the at least one buffer circuit is based at least in part on a layout of the at least one buffer circuit.

13. The method of claim 11, wherein the step of determining the delay of the at least one buffer circuit comprises performing parasitic parameter extraction on a layout of the at least one buffer circuit.

14. The method of claim 11, wherein the RC loading structure comprises a polysilicon routing connected between the output of the first inverter stage and the input of the second inverter stage, the step of controlling the delay of the at least one buffer circuit comprising at least one of varying at least one of an effective length of the polysilicon routing and a shape of the polysilicon routing, varying a doping concentration of the polysilicon routing, and adding a silicide layer to the polysilicon routing, to thereby control at least one of a resistance and a capacitance of the polysilicon routing.

15. The method of claim 14, wherein the polysilicon routing comprises at least one jumper operative to electrically short two or more elements of the polysilicon routing, at least one of the resistance and the capacitance of the polysilicon routing being controlled by adjusting a position of the jumper along the polysilicon routing.

16. The method of claim 15, wherein the step of controlling the delay of the at least one buffer circuit comprises iteratively measuring the delay of the buffer circuit and adjusting the position of the jumper along the polysilicon routing until the clock skew in the integrated circuit is within a prescribed range.

17. The method of claim 15, wherein the step of controlling the delay of the at least one buffer circuit comprises iteratively measuring the delay of the buffer circuit and adjusting the position of the jumper along the polysilicon routing until the clock skew in the integrated circuit is less than or equal to a prescribed value.

18. The method of claim 11, further comprising configuring a drive capability of the second inverter stage to be greater than a drive capability of the first inverter stage in the buffer circuit.

19. An electronic system, comprising:
   at least one integrated circuit including an apparatus for controlling clock skew in the integrated circuit, the apparatus comprising:
      timing circuitry operative to generate a clock signal for distribution in the integrated circuit; and
      at least one buffer circuit operative to receive the clock signal and to generate a delayed version of the clock signal as an output thereof, the buffer circuit including at least first and second inverter stages and a resistive-capacitive (RC) loading structure, an output of the first inverter stage being connected to an input of the second inverter stage via the RC loading structure, the buffer circuit having a delay associated therewith that is selectively varied as a function of one or more adjustable characteristics of the RC loading structure;

wherein clock skew in the integrated circuit is controlled as a function of the delay of the at least one buffer circuit;

wherein the second inverter stage comprises a first plurality of transistors and a second plurality of transistors, the first plurality of transistors being of opposite conductivity relative to the second plurality of transistors, the RC loading structure being connected to the first and second plurality of transistors and completing an electrical path between the first plurality of transistors and the second plurality of transistors.

* * * * *